(12) United States Patent
Pawlowicz et al.

(10) Patent No.: US 12,176,177 B2
(45) Date of Patent: Dec. 24, 2024

(54) ION BEAM CHAMBER FLUID DELIVERY APPARATUS AND METHOD AND ION BEAM ETCHER USING SAME

(71) Applicant: TECHINSIGHTS INC., Ottawa (CA)

(72) Inventors: Christopher Pawlowicz, Ottawa (CA); Alexander Sorkin, Nepean (CA); Trevor Jason French, Carleton Place (CA); Ian Jones, Ottawa (CA); Paul Gagnon, Maberly (CA)

(73) Assignee: TECHINSIGHTS INC., Ottawa (CA)

( * ) Notice: Subject to any disclaimer, the term of this patent is extended or adjusted under 35 U.S.C. 154(b) by 375 days.

(21) Appl. No.: 17/805,663

(22) Filed: Jun. 6, 2022

(65) Prior Publication Data

US 2022/0399179 A1     Dec. 15, 2022

(30) Foreign Application Priority Data

Jun. 9, 2021 (CA) .................. CA 3121768

(51) Int. Cl.
*H01J 37/08* (2006.01)
*H01J 37/32* (2006.01)

(52) U.S. Cl.
CPC .......... *H01J 37/08* (2013.01); *H01J 37/3244* (2013.01); *H01J 37/32743* (2013.01); *H01J 2237/3174* (2013.01)

(58) Field of Classification Search
CPC .. H01J 37/08; H01J 37/3244; H01J 37/32743; H01J 2237/3174
See application file for complete search history.

(56) References Cited

U.S. PATENT DOCUMENTS

| 5,976,328 A | 11/1999 | Azuma et al. |
| 2009/0152459 A1 | 6/2009 | Buhler et al. |

FOREIGN PATENT DOCUMENTS

| JP | S59194258 U | 12/1984 |

OTHER PUBLICATIONS

Extended European Search Report for EP Patent Application 22177388.0 dated Nov. 7, 2022, 13 pages.

*Primary Examiner* — Nicole M Ippolito
*Assistant Examiner* — Hanway Chang
(74) *Attorney, Agent, or Firm* — Knobbe, Martens, Olson & Bear, LLP (57) ABSTRACT

Described are various embodiments of an ion beam chamber fluid delivery system and method for delivering a fluid onto a substrate in an ion beam system during operation. In one embodiment, the system comprises: a chamber comprising an ion beam gun oriented so as to cause ions to impinge the substrate, said chamber having a fluid delivery conduit therein for delivering the fluid into the chamber; a transferable substrate stage for holding the substrate, the transferable stage further configured to move between an operating position and a payload position during non-operation, said payload position for receiving and removing said substrate; and a fluid delivery nozzle being in a fixed location relative to the transferable stage, at least during operation, with an outlet position that is configured to deliver a fluid to a predetermined location on said transferable stage.

18 Claims, 5 Drawing Sheets

Figure 6

ION BEAM CHAMBER FLUID DELIVERY APPARATUS AND METHOD AND ION BEAM ETCHER USING SAME

FIELD OF THE DISCLOSURE

The present disclosure relates to ion beam milling, and, in particular, to an ion beam chamber fluid delivery apparatus and method and ion beam etcher using same.

BACKGROUND

Removing a layer in a substrate such as a semiconductor die involves removing very small amounts and very thin layers of an integrated circuit, which contains metals and dielectrics, for example, to reveal the underlying circuitry in a precise and controlled manner. Ion beam milling is one method used to de-layer such a sample. In general, ion beam mills may be used for various other purposes in the semiconductor industry, such as film deposition or surface modification or activation.

In addition, an ion beam mill may also comprise elements to introduce various reactive and/or non-reactive gasses near the substrate's surface during the milling process. These gases or fluids released near the surface of a sample may be used to enhance for example the milling/etch rate or aspect ratio. These may include process gases used to generate reactive ions, or background gases released into the vacuum pumped chamber.

This background information is provided to reveal information believed by the applicant to be of possible relevance. No admission is necessarily intended, nor should be construed, that any of the preceding information constitutes prior art or forms part of the general common knowledge in the relevant art.

SUMMARY

The following presents a simplified summary of the general inventive concept(s) described herein to provide a basic understanding of some aspects of the disclosure. This summary is not an extensive overview of the disclosure. It is not intended to restrict key or critical elements of embodiments of the disclosure or to delineate their scope beyond that which is explicitly or implicitly described by the following description and claims.

In accordance with one aspect, there is provided an ion beam chamber fluid delivery system for delivering a fluid onto a substrate in an ion beam system during operation, said system comprising: a chamber comprising an ion beam gun oriented so as to cause ions to impinge the substrate, said chamber further comprising a sealable opening for receiving the substrate and said chamber having a fluid delivery conduit therein for delivering the fluid into the chamber; a transferable stage for holding the substrate, the transferable stage further configured to move between an operating position and a payload position during non-operation, said payload position for receiving and removing said substrate via said sealable opening; and a fluid delivery nozzle being in a fixed location relative to the transferable stage, at least during operation, with an outlet position that is configured to deliver a fluid to a predetermined location on said transferable stage, the fluid delivery nozzle being in fluid communication with the fluid delivery conduit via a nozzle conduit connector that permits the fluid delivery nozzle to remain substantially fixed relative to the transferable stage when the stage is in the operating position; wherein the fluid delivery conduit comprises a conduit engager that is removably and sealably engageable with said nozzle conduit connector when said transferable stage is moved into said operating position from said payload position.

In one embodiment, the outlet position directs the fluid to a contact location associated with the substrate.

In one embodiment, the contact location is substantially coincident with a point of impingement resulting from the ion beam gun.

In one embodiment, the transferable stage is further configured to move the substrate during operation of the ion beam system in at least one of a translational movement and a rotational movement around one or more axes.

In one embodiment, the fluid is one of: a gas, a liquid, and a mixture thereof.

In one embodiment, the fluid delivery conduit is deformably flexible.

In one embodiment, at least one of the fluid delivery conduit and the nozzle conduit connector comprise at least one rotational cuff, said rotational cuff configured to permit free rotation around at least one of the axes of rotation while maintaining fluid communication.

In one embodiment, the conduit engager and the nozzle conduit engager are rotatable relative to each other around a given axis of rotation while maintaining fluid communication.

In one embodiment, the fluid is distinct from a chamber gas in at least one of the following characteristics: composition, temperature, phase, pressure, and density.

In one embodiment, the fluid is controllably delivered by the fluid delivery nozzle by controlling one or more of the following: fluid flow rate, fluid composition, fluid temperature, and fluid pressure in the fluid delivery nozzle.

In one embodiment, the said fluid delivery conduit is moveable relative to the transferable stage.

In one embodiment, said fluid delivery nozzle has a shower-head configuration or a bell-shaped configuration.

In accordance with another aspect, there is provided a fluid delivery method for delivering a fluid onto a substrate in an ion beam system during operation thereof, said ion beam system comprising an ion beam gun for generating an ion beam in an ion beam chamber, the process comprising: configuring a fluid delivery nozzle above a transferable stage, said transferable stage for holding thereon a substrate to be impinged at one or more impingement location by ions resulting from the use of said ion beam so that said fluid delivery nozzle is operable to deliver fluid onto said substrate during impingement, said fluid delivery nozzle being affixed so as to stay in substantially the same position during impingement relative to the transferable stage, the fluid delivery nozzle being in fluid communication with a nozzle input engager for removably and sealably engaging with a corresponding fluid conduit engager of a fluid input conduit when the transferable stage is moved from a payload position to an operating position; loading the substrate onto said transferable stage that is in said payload position; moving said transferable stage from said payload position to said operating position; operating the ion beam system; and applying the fluid to the substrate via the fluid input conduit during said operation.

In one embodiment, the method further comprises: adjusting the position of said substrate within said sealed ion beam chamber during operation of the ion beam system.

In one embodiment, the fluid comprises a gas, a liquid, and a mixture thereof.

In one embodiment, the method further comprises: adding a process gas to at least one of an ion beam source or the ion beam chamber.

In one embodiment, the step of applying comprises adjusting one or more of the following: fluid composition, fluid temperature, fluid phase, fluid pressure at said fluid delivery nozzle, and fluid flow rate.

In one embodiment, the adjusting is based on a preconfigured automated application program for automatically carrying out said adjustments.

Other aspects, features and/or advantages will become more apparent upon reading of the following non-restrictive description of specific embodiments thereof, given by way of example only with reference to the accompanying drawings.

BRIEF DESCRIPTION OF THE FIGURES

Several embodiments of the present disclosure will be provided, by way of examples only, with reference to the appended drawings, wherein.

Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood elements that are useful or necessary in commercially feasible embodiments are often not depicted in order to facilitate a less obstructed view of these various embodiments of the present disclosure.

DETAILED DESCRIPTION

Various implementations and aspects of the specification will be described with reference to details discussed below. The following description and drawings are illustrative of the specification and are not to be construed as limiting the specification. Numerous specific details are described to provide a thorough understanding of various implementations of the present specification. However, in certain instances, well-known or conventional details are not described in order to provide a concise discussion of implementations of the present specification.

Various apparatuses and processes will be described below to provide examples of implementations of the system disclosed herein. No implementation described below limits any claimed implementation and any claimed implementations may cover processes or apparatuses that differ from those described below. The claimed implementations are not limited to apparatuses or processes having all of the features of any one apparatus or process described below or to features common to multiple or all of the apparatuses or processes described below. It is possible that an apparatus or process described below is not an implementation of any claimed subject matter.

Furthermore, numerous specific details are set forth in order to provide a thorough understanding of the implementations described herein. However, it will be understood by those skilled in the relevant arts that the implementations described herein may be practiced without these specific details. In other instances, well-known methods, procedures and components have not been described in detail so as not to obscure the implementations described herein.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" may be construed as X only, Y only, Z only, or any combination of two or more items X, Y, and Z (e.g., XYZ, XY, YZ, ZZ, and the like). Similar logic may be applied for two or more items in any occurrence of "at least one . . . " and "one or more . . . " language.

Unless defined otherwise, all technical and scientific terms used herein have the same meaning as commonly understood by one of ordinary skill in the art.

Throughout the specification and claims, the following terms take the meanings explicitly associated herein, unless the context clearly dictates otherwise. The phrase "in one of the embodiments" or "in at least one of the various embodiments" as used herein does not necessarily refer to the same embodiment, though it may. Furthermore, the phrase "in another embodiment" or "in some embodiments" as used herein does not necessarily refer to a different embodiment, although it may. Thus, as described below, various embodiments may be readily combined, without departing from the scope or spirit of the innovations disclosed herein.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

Ion beam systems are well established in the semiconductor industry and come in a variety of configurations for a number of different uses. For example, in Focused Ion Beam (FIB) systems, a focused beam is generated and the beam is accelerated down a column. The beam is then manipulated by applying electromagnetic energy through a system of coils (and electrostatic lenses), and the resulting beam emerges in a vacuum pumped chamber and strikes a sample/target. For FIB, the beam consists of ions as ion beams have much more kinetic energy than electron beams. By striking a sample with high power, material can be milled away and removed. By adding background or chamber gas and striking the sample with lower energy, new material can be deposited.

By manipulating the beam and adding a gas close to the sample, one can deposit and remove material in a precise and controlled manner. Standard gases which may be used include xenon difluoride, tetramethylcyclotetrasiloxane (TMCTS), platinum, tungsten, and other well-known gases. However, it may be difficult or challenging to deliver the standard fluids or gases mentioned above in an efficient manner. Indeed, not all gas and/or fluid molecules may be delivered near the substrate's surface. Furthermore, accurately delivering the gas or fluid is further complicated by the fact that the ion beam irradiation is done in a sealed chamber under vacuum and that the state rotates or may change orientation.

Thus, the systems and methods described herein provide, in accordance with different embodiments, different examples of an ion chamber fluid delivery apparatus and method for controllably delivering a fluid directly onto a substrate in an ion beam system during the operation thereof.

Figure 1:
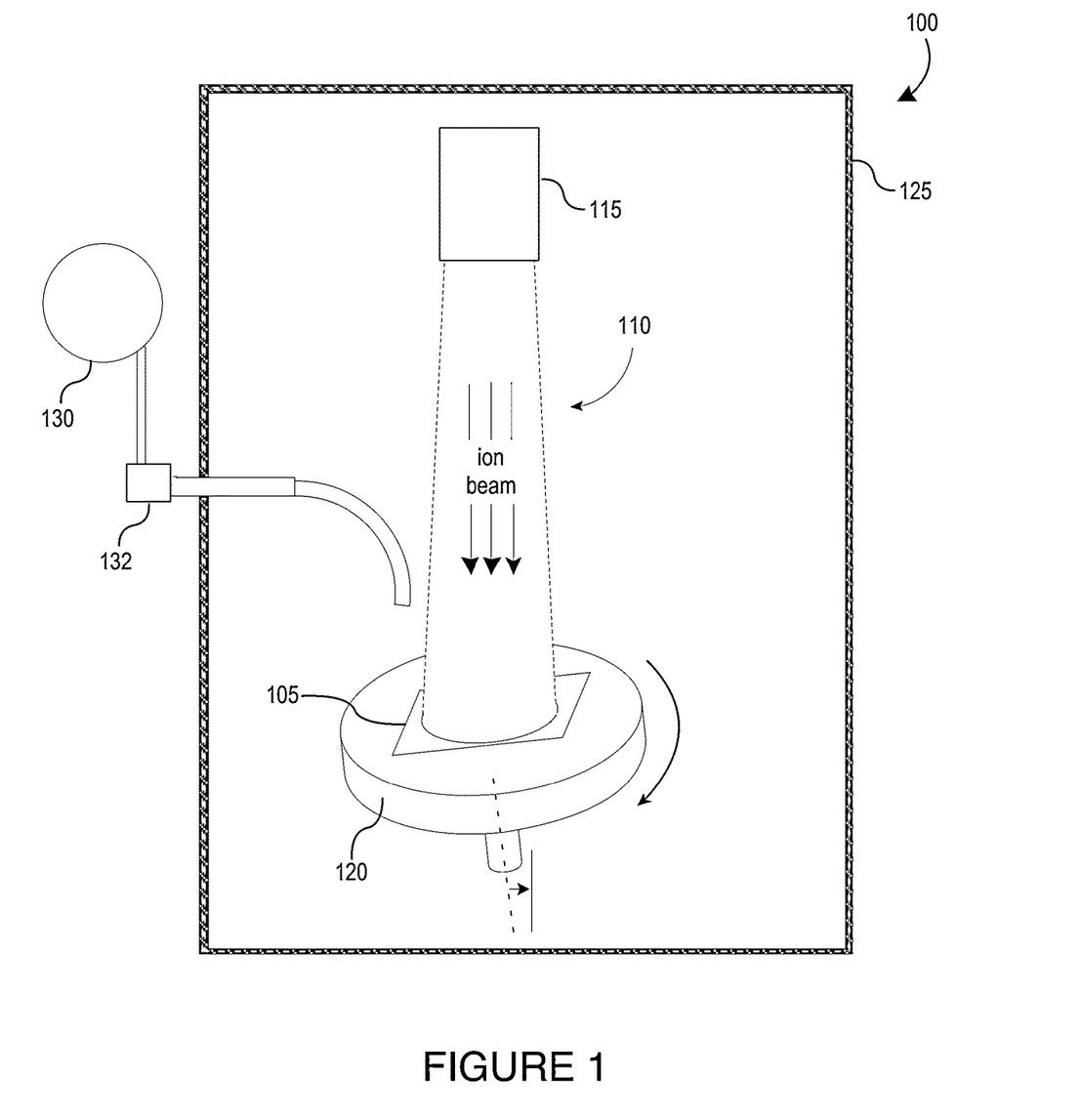
FIG. 1 is a schematic diagram of an ion beam milling system, in accordance with one embodiment.

With reference to FIG. 1, and in accordance with one embodiment, an exemplary ion beam milling system, generally referred to using the numeral 100, will now be described. In this exemplary embodiment, the system 100 may be used in the context of a sample or substrate 105 being impinged by an ion beam 110 generated by an ion beam gun 115. Ion beam gun 115 may be part of a broad ion beam (BIB) mill, a focused ion beam (FIB) mill, a plasma FIB mill, or other ion beam technologies, as may be readily appreciated by the skilled artisan. Such an ion beam gun is generally configured by adjusting one or more of its operating characteristics. The one or more ion beam mill operating characteristics may be associated with a predetermined rate at which a material may be removed. Delayering a sample may be achieved by configuring the ion mill to remove one or more materials from the sample at their respective predetermined rates. The association of rates of removal to sets of ion mill operating characteristics may be obtained experimentally through trial and error or via simulation methods. The rates of removal and their associated sets of ion mill operating characteristics may be logged or stored for future manipulation of the ion mill in any storage medium such as a database, memory device, computing storage device or any storage medium as would be known to a worker skilled in the art.

Another tool for influencing etch rates/selectivity is the use of additional or substitutional gasses either directly in the ion-source (i.e. source gases), or as a background or chamber gas fragmented by the ion-beam then able to selectively react on the surface.

In some embodiments, ion beam mill 115 may also consist of one or more ion beam sources (not shown). For example, ion mill 115 may comprise one or more large diameter gridded ion beam source, such as an argon source, but other ion sources, such as elemental gold, gallium, iridium, xenon, as well any other suitable ion sources, may also be used.

Vacuum gauges, a load-lock, vacuum pumps, one or more control panels, and one or more processors may also be associated with the ion mill. Furthermore, one or more ion beam sources may be associated with apertures and electrostatic lenses. It is to be understood that the operation of an ion mill and the various fundamental components of an ion mill would be readily known to a worker skilled in the art. The substrate 105 may be mounted on a, variable angle, cooled substrate stage 120 that can be tilted and rotated. As mentioned above, such a substrate stage 120 may be housed in a vacuum chamber 125 (also referred herein as an "ion beam chamber"). Vacuum chamber 125 is generally operable to be sealed so that a substantial vacuum may be produced within via one or more vacuum pumps. The skilled worker in the art will readily understand how a sample is affixed to such a rotating stage 120, including the different methods of producing the required vacuum inside chamber 125.

Regarding the conditions and settings for the focused ion beam, various parameters may be adjusted and/or set for optimum resulting image quality. These parameters include voltage, current, dwell time, as well as other parameters. Such parameters and their effects and settings are well known to those versed in the art of focused ion beam techniques. For the electron detector, parameters which may be adjusted to obtain a suitable image quality include, among others, brightness, contrast, and line averaging.

Traditionally, gas or fluid injection systems are also used to deliver different process gasses during milling. For example, in FIG. 1, fluids contained for example in an external fluid source 130 located outside of chamber 125 may be introduced therein in a controlled fashion via a gas controller 132. The fluids introduced therein may include liquids, gases (including but not limited to the gases mentioned above) or a combination or mixture thereof. In some embodiments, the fluid may be distinct from a chamber gas and/or process gas. For example, and without limitation, the fluid may be distinct the chamber gas in composition, temperature, phase, pressure, and/or density. The skilled technician will appreciate that different means of providing fluid at a pre-determined flow rate may be used, without limitation.

In some embodiments, a plasma bridge neutralizer (not shown) may also be used to neutralize the ion beam.

However, in some cases, there is a need to deliver fluid at a precise location near or on the surface of substrate 105. In these cases, efficient delivery may require that the fluid be delivered in close proximity to the substrate surface. This may be difficult if the fluid delivery mechanism or system is completely independent from the stage itself, as illustrated in FIG. 1. For example, tilting or rotating stage 120, as mentioned above, may result in a reduced yield if the fluid delivery mechanism is not allowed to move in conjunction therewith. For example, once chamber 125 is sealed it may be determined that stage 120 must be further moved or rotated. However, if the fluid delivery output or nozzle is located inside chamber 125 but not able to move with stage 120, it may be difficult or impossible to make the necessary adjustments so that fluid delivery is still efficient unless chamber 125 is pressurized and reopened.

Figure 2A:
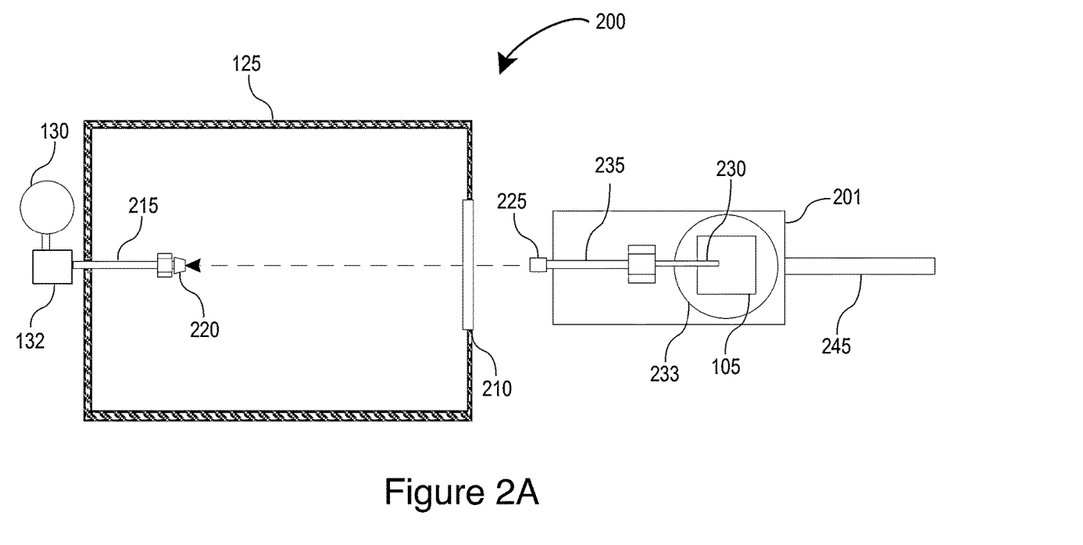
FIGS. 2A and 2B are schematic diagrams of gas delivery system in a payload configuration and in a delivery configuration, respectively, in accordance with one embodiment.

With reference to FIG. 2A to 5B, and in accordance with one exemplary embodiment, an ion beam chamber fluid delivery system for delivering a fluid onto a substrate in an ion beam system during operation, generally referred to using the numeral 200, will now be described. FIGS. 2A and 2B show a top view of an ion beam chamber fluid delivery system 200 in two different configurations, a payload configuration (FIG. 2A), which allows fluid delivery (i.e. the "payload") to be properly configured over substrate 105 outside of vacuum chamber 125, and a delivery configuration (FIG. 2B), wherein a transferable stage 201 is moved into ion beam chamber 125 with the fluid delivery system properly configured and attached thereto.

Figure 2B:
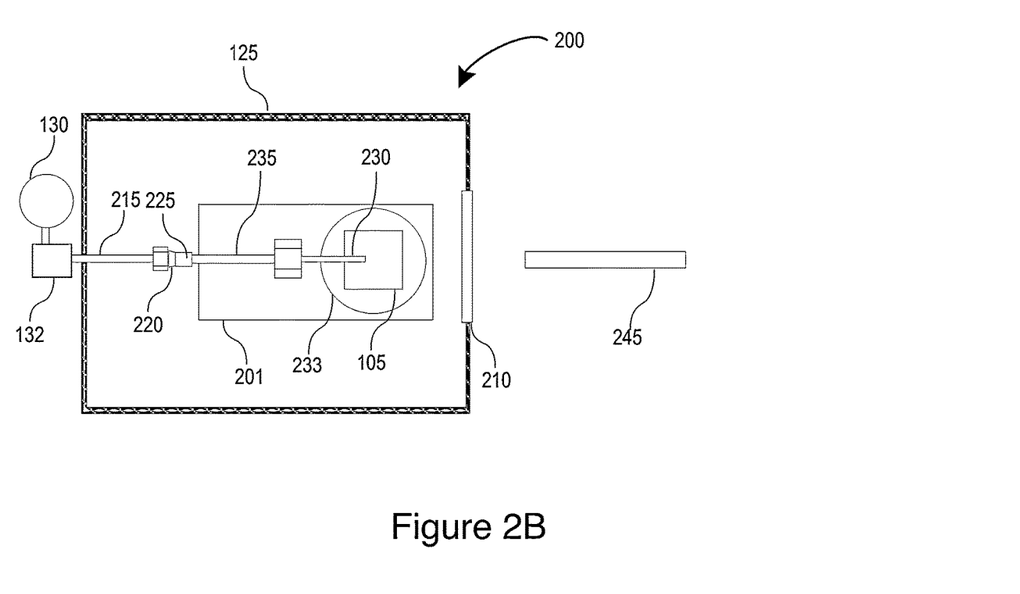

In both FIGS. 2A and 2B, vacuum chamber 125 is shown comprising a sealable opening 210 for receiving, in part, transferable stage 201 and a fluid delivery conduit 215 for delivering a fluid from external fluid source 130. As mentioned above, fluid source 130 may be configured to controllably release fluid into conduit 215 at a pre-determined flow rate via gas controller 132. Other fluid parameters that may be controlled include, without limitation: fluid composition and fluid temperature.

As mentioned above, the fluid or fluids may include, at least in part, gases, including but not limited to: a tungsten precursor (e.g. tungsten hexacarbonyl $W(CO)_6$), a platinum precursor (e.g. methyl cyclopentadienyl trimethyl platinum such as $\{(CH_3)_3Pt(CpCH_3)\}$, $C_5H_5Pt(CH_3)_3$) or $(CH_3C_5H_4)(CH_3)_3Pt$), Xenon Difluoride ($XeF_2$), TMCTS or sulfur hexafluoride ($SF_6$). The skilled technician will understand that different gases may be used in the context of ion milling, without limitation.

In some embodiments, the end of fluid delivery conduit 215 inside chamber 125 comprises an output conduit engager 220 operable to be removably engageable with a corresponding input conduit engager 225, as will be further discussed below.

Figure 3:
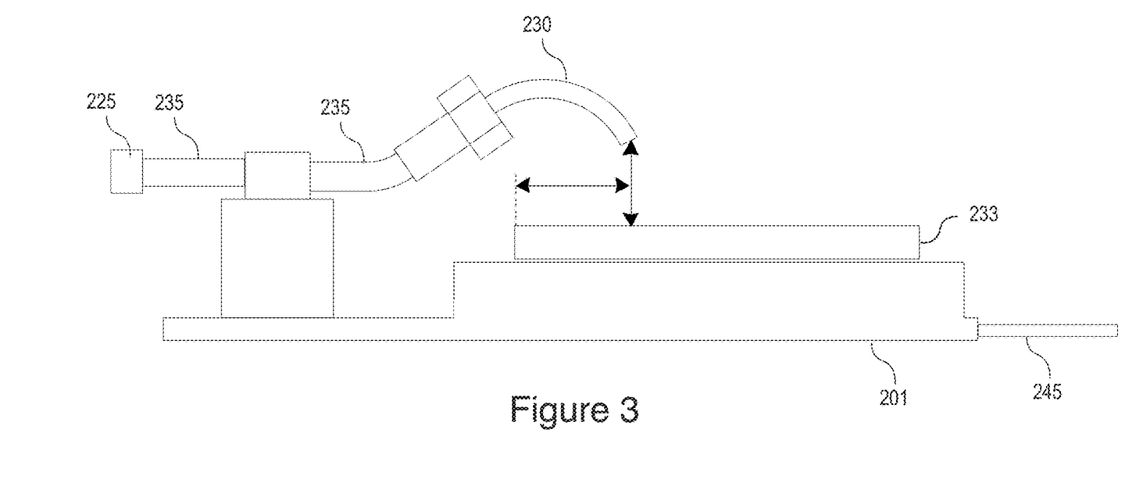
FIG. 3 is a schematic diagram showing a side view of the transferable stage of the system shown in FIGS. 2A and 2B comprising, in part, a fluid delivery nozzle affixed thereto, in accordance with one embodiment.

In this exemplary embodiment, stage 201 is shown having affixed thereto a fluid delivery nozzle 230 for delivering fluid above substrate 105. This way, transferable stage 201 may be used to move in substrate 105 in and out of chamber 125 as required while keeping fluid delivery nozzle 230 in the same relative position thereto. Moreover, both transferable stage 201 and fluid delivery nozzle 230 may thus be both tilted, rotated or translated as one according to one or more directional axes. In addition, this exemplary embodiment, substrate 105 may be held on an additional or optional substrate holder 233, which, in some embodiments, may be actuated or configured to rotate about its central axis or translated with respect to transferable stage 201 during milling. A side view of stage 201 (with all of the above-mentioned elements affixed thereto and in accordance with one embodiment) is shown in FIG. 3.

Fluid delivery nozzle 230 may further be connected to one end of an intake conduit 235 while the opposite end of intake conduit 235 comprises the input conduit engager 225 mentioned above. Thus, the apparatus discussed above, in some embodiments, allows to configure how fluid is delivered to a predetermined location by allowing the position and/or orientation of the outlet of fluid delivery nozzle 230 with respect to the substrate 105 to be configured prior to substrate 105 being taken inside chamber 125.

Figure 4:
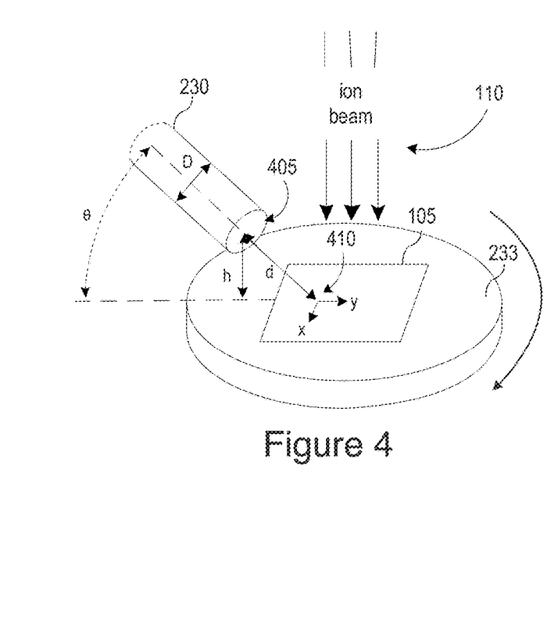
FIG. 4 is a process flow chart illustrating a delivery gas nozzle configuration, in accordance with one embodiment.

As shown in FIG. 4, in some embodiments, the outlet position of fluid delivery nozzle may be configured so as to direct fluid to a contact location on substrate 105. This contact location may be substantially coincident with a point of impingement resulting from the ion beam gun. Configuring fluid delivery nozzle 230 may include, without limitation, changing: the distance d between the opening or outlet 405 and the location (e.g. x/y in cartesian coordinates) of the payload target 410, the distance d of opening 405 from payload target 410, the delivery angle θ, and the height h of opening 405 with respect to a location on transferable stage 201. In some embodiments, this may also include changing nozzle 230 for a different unit having different mechanical or fluid delivery characteristics. These fluid delivery characteristics may include any physical features that may influence the rate of fluid delivery, for example fluid pressure. These may include, without limitation, the diameter D of the opening (see FIG. 3B) and/or the overall shape or geometry of nozzle 230 (including its length and curvature thereof, tapered or not, etc.). In addition, in some embodiments, delivery nozzle 230 may take a shape or configuration similar to a shower head nozzle (not shown) thus comprising multiple openings or outlets so as to release fluid at different locations and/or at different flow rate and/or pressures simultaneously. In some embodiments, delivery nozzle 230 may take the shape or configuration of a bell-shaped nozzle. For example, this may include a bell-shaped configuration comprising an interior portion or volume and being configured to substantially enclose or cover the substrate when the nozzle is positioned over said substrate, so as to release the fluid within said interior portion via one or more inward-facing outlets thereby allowing for increased fluid pressures; and further comprising an aperture or hole on the surface thereof for letting the ion beam reach the substrate thereunder. The skilled technician will appreciate that any means of affixing nozzle 230 to intake conduit 235 known in the art may be used without limitation.

Going back to FIGS. 2A and 2B, in some embodiments, a pole or extending portion 245 removably affixed to the end of stage 201 opposite to sealable opening 210 may be used to push or pull stage 201 in or out of chamber 125. In some embodiments, transferable stage 201 may be operable to slide or move via one or more rails or similar (not shown). In some embodiments, stage 201 may be displaced directly or indirectly with the use of a motor or actuator (also not shown), including, but not limited to a screw motor. In some embodiments, the motor or actuator may be used to move extending portion 245.

Furthermore, as mentioned above, in the payload configuration (FIG. 2A) stage 201 is placed outside of chamber 125 while in the delivery configuration (FIG. 2B), it is moved inside via opening 210. Thus, input conduit engager 225 may be configured so that when stage 201 is moved into chamber 125 (e.g. from FIG. 2A to FIG. 2B), input conduit engager 225 automatically and sealably engages with output conduit engager 220 of fluid delivery conduit 215. In some embodiments, engagers 220 and 225 may be configured so as to be, at least partially, self-aligning. Once engaged, in the operating position of FIG. 2B, engagers 220 and 225 provide a fluid connection to the fluid source 130 so that fluid may flow and be delivered via fluid delivery nozzle 230 to a predetermined location on transferable stage 201. In some embodiments, engagers 220 and 225 are further configured to automatically disengage upon stage 201 being moved back outside chamber 125, for example once the ion milling process is over.

In some embodiments, output conduit engager 220 and input conduit engager 225 may be configured so as to allow some degree of motion during engagement. The skilled technician will understand that different removably engageable mechanisms may be used, without limitation.

Figure 5A:
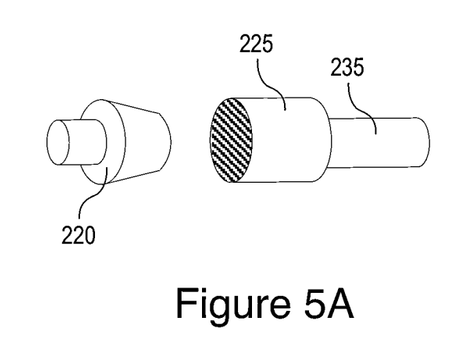
FIGS. 5A to 5D are schematic diagrams illustrating different means used for allowing some degree of motion of output conduit engager and input conduit engager during engagement, in accordance with different embodiments.
Figure 5B:
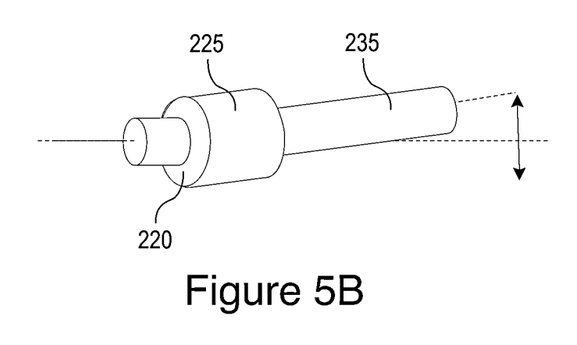

One example, illustrated in FIGS. 5A and 5B, is having either output conduit engager 220 and input conduit engager 225 comprising a rotational cuff or the like. This rotational cuff may be configured to permit free rotation around at least one of the axes of rotation while maintaining fluid communication, as shown in FIG. 5B.

Figure 5C:
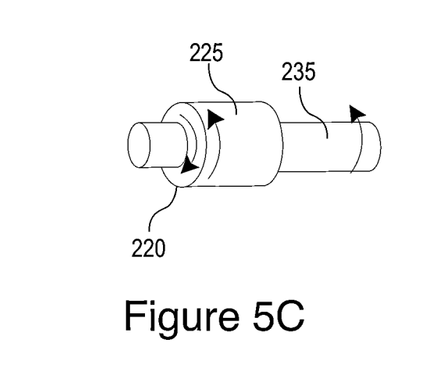

In some embodiments, output conduit engager 220 and input conduit engager 225 may be rotatable relative to each other around a given axis of rotation while maintaining fluid communication. This is illustrated in FIG. 5C.

Figure 5D:
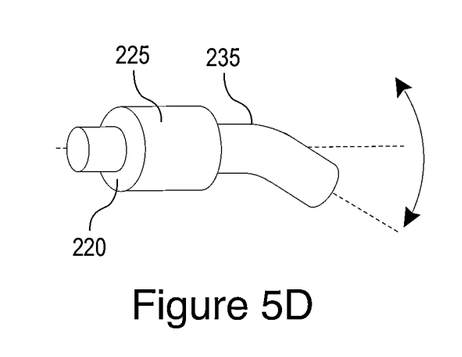

In some embodiments, fluid intake conduit 235 (or at least a section or portion thereof) may be substantially deformably flexible so as to allow it to bend or deform to accommodate some translational/tilting/rotational motion of transferable stage 201 once input conduit engager 225 and output conduit engager 220 are engaged. This is illustrated in FIG. 5D.

Figure 6:
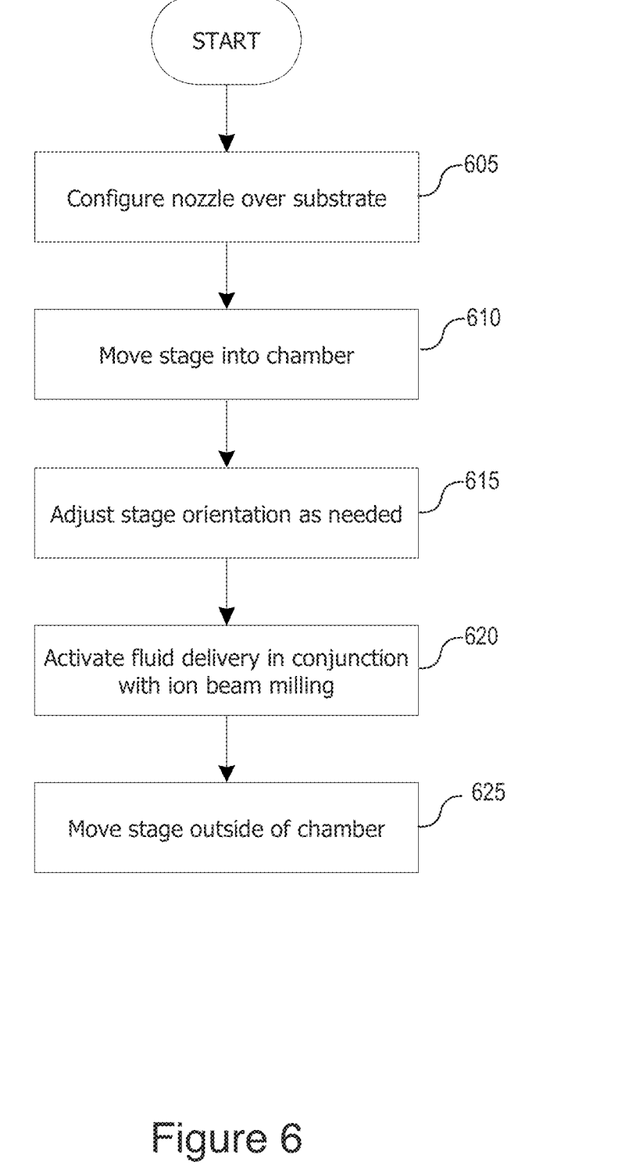
FIG. 6 is a flow process diagram illustrating a fluid delivery method for delivering fluid onto a substrate in an ion beam system during operation thereof, in accordance with one embodiment.

With reference to FIG. 6, and in accordance with one embodiment, a fluid delivery method for delivering fluid inside an ion beam chamber, generally referred to using the numeral 600, will now be described.

At step 605, stage 201 is located outside chamber 125 (in the payload configuration) so that nozzle 230 may be properly configured as required above substrate 105. As mentioned above, configuring nozzle 230 may include changing the distance of its opening with respect to the position of substrate 105 and/or the expected delivery angle.

Once nozzle 230 is properly configured, at step 610, stage 201 is moved into chamber 125 via sealable opening 210. As mentioned above, output conduit engager 220 and input conduit engager 225 are operable to automatically engage with one another. Vacuum chamber 125 may be then be sealed and depressurized as required.

At step 615, stage orientation may be changed as needed or required, system 100 insuring that a fluid connection is kept at all times, irrespective of the position or orientation of stage 201.

At step 620, the ion mill may be activated and the ion milling process started in conjunction with activation of the fluid source, again as required. As discussed above, fluid source 130 may be operationally connected to gas controller 132 so as to release said fluid in a controlled manner. In some embodiments, the delivery of the fluid may be adjusted in real-time during the ion milling process. These adjustments may include adjusting, without limitation: fluid composition, fluid temperature, fluid phase, fluid pressure at said fluid delivery nozzle, and fluid flow rate. In some embodiments, these adjustments may be based on on a preconfigured automated application program for automatically carrying out said adjustments.

In addition, in some embodiments, one or more additional process gases may be added to the ion beam source or inside chamber 125 in a more conventional manner during milling.

In some embodiments, the position of substrate 105 may be adjusted remotely during milling, for example via substrate holder 233 (shown in FIGS. 2A-2B, 3 and 4) and which may be configured to rotate or translate with respect to stage 201.

Finally, at step 625, once the ion milling process is finished, stage 201 may be moved back outside of chamber 125. As discussed above, output conduit engager 220 and input conduit engager 225 are operable to automatically disengage or disconnect from each other, severing the fluid connection. Thereafter, once stage 201 is outside chamber 125, substrate 105 may be removed from stage 201 and the process may be repeated with a new substrate.

While the present disclosure describes various embodiments for illustrative purposes, such description is not intended to be limited to such embodiments. On the contrary, the applicant's teachings described and illustrated herein encompass various alternatives, modifications, and equivalents, without departing from the embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become apparent to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims. Moreover, no requirement exists for a system or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, as may be apparent to those of ordinary skill in the art, are also encompassed by the disclosure.

What is claimed is:

1. An ion beam chamber fluid delivery system for delivering a fluid onto a substrate in an ion beam system during operation, said ion beam chamber fluid delivery system comprising:
    a chamber comprising an ion beam gun oriented so as to cause ions to impinge the substrate, said chamber further comprising a sealable opening for receiving the substrate and said chamber having a fluid delivery conduit therein for delivering the fluid into the chamber;
    a transferable stage for holding the substrate, the transferable stage further configured to move between an operating position and a payload position during non-operation, said payload position for receiving and removing said substrate via said sealable opening; and
    a fluid delivery nozzle being in a fixed location relative to the transferable stage, at least during operation, with an outlet position that is configured to deliver a fluid to a predetermined location on said transferable stage, the fluid delivery nozzle being in fluid communication with the fluid delivery conduit via a nozzle conduit connector that permits the fluid delivery nozzle to remain substantially fixed relative to the transferable stage when the transferable stage is in the operating position;
    wherein the fluid delivery conduit comprises a conduit engager that is removably and sealably engageable with said nozzle conduit connector when said transferable stage is moved into said operating position from said payload position.

2. The ion beam chamber fluid delivery system of claim 1, wherein the outlet position directs the fluid to a contact location associated with the substrate.

3. The ion beam chamber fluid delivery system of claim 2, wherein the contact location is substantially coincident with a point of impingement resulting from the ion beam gun.

4. The ion beam chamber fluid delivery system of claim 1, wherein the transferable stage is further configured to move the substrate during operation of the ion beam system in at least one of a translational movement and a rotational movement around one or more axes.

5. The ion beam chamber fluid delivery system of claim 1, wherein the fluid is one of: a gas, a liquid, or a mixture thereof.

6. The ion beam chamber fluid delivery system of claim 1, wherein the fluid delivery conduit is deformably flexible.

7. The ion beam chamber fluid delivery system of claim 1, wherein at least one of the fluid delivery conduit and the nozzle conduit connector comprise at least one rotational cuff, said at least one rotational cuff configured to permit free rotation around at least one of one or more axes of rotation while maintaining fluid communication.

8. The ion beam chamber fluid delivery system of claim 1, wherein the conduit engager and the nozzle conduit connector are rotatable relative to each other around a given axis of rotation while maintaining fluid communication.

9. The ion beam chamber fluid delivery system of claim 1, wherein the fluid is distinct from a chamber gas in at least one of the following characteristics: composition, temperature, phase, pressure, or density.

10. The ion beam chamber fluid delivery system of claim 1, wherein the fluid is controllably delivered by the fluid delivery nozzle by controlling one or more of: fluid flow rate, fluid composition, fluid temperature, or fluid pressure in the fluid delivery nozzle.

11. The ion beam chamber fluid delivery system of claim 1, wherein the fluid delivery conduit is moveable relative to the transferable stage.

12. The ion beam chamber fluid delivery system of claim 1, wherein said fluid delivery nozzle has a shower-head configuration or a bell-shaped configuration.

13. A fluid delivery method for delivering a fluid onto a substrate in an ion beam system during operation thereof, said ion beam system comprising an ion beam gun for generating an ion beam in an ion beam chamber, the fluid delivery method comprising:

configuring a fluid delivery nozzle above a transferable stage, said transferable stage for holding thereon a substrate to be impinged at one or more impingement location by ions resulting from use of said ion beam so that said fluid delivery nozzle is operable to deliver the fluid onto said substrate during impingement, said fluid delivery nozzle being affixed so as to stay in substantially same position during impingement relative to the transferable stage, the fluid delivery nozzle being in fluid communication with a nozzle input engager for removably and sealably engaging with a corresponding fluid conduit engager of a fluid input conduit when the transferable stage is moved from a payload position to an operating position;

loading the substrate onto said transferable stage that is in said payload position;

moving said transferable stage from said payload position to said operating position;

operating the ion beam system; and applying the fluid to the substrate via the fluid input conduit during said operation.

14. The fluid delivery method of claim 13, further comprising:

adjusting a position of said substrate within said ion beam chamber during operation of the ion beam system.

15. The fluid delivery method of claim 13, wherein the fluid comprises a gas, a liquid, or a mixture thereof.

16. The fluid delivery method of claim 13, further comprising:

adding a process gas to at least one of an ion beam source or the ion beam chamber.

17. The fluid delivery method of claim 13, wherein said applying comprises adjusting one or more of: fluid composition, fluid temperature, fluid phase, fluid pressure at said fluid delivery nozzle, or fluid flow rate.

18. The fluid delivery method of claim 17, wherein said adjusting is based on a preconfigured automated application program for automatically carrying out adjustments.

* * * * *